(12) United States Patent
Glovatsky et al.

(10) Patent No.: US 6,320,128 B1
(45) Date of Patent: Nov. 20, 2001

(54) ENVIRONMENTALLY-SEALED ELECTRONIC ASSEMBLY AND METHOD OF MAKING SAME

(75) Inventors: Andrew Zachary Glovatsky, Plymouth; Brenda Joyce Nation, Troy; Charles Frederick Schweitzer, Northville; Daniel Phillip Dailey, West Bloomfield; Delin Li, Canton; Jay DeAvis Baker, Dearborn; Lakhi Nandlal Goenka, Ann Arbor; Lawrence LeRoy Kneisel, Novi; Myron Lemecha, Dearborn Heights, all of MI (US)

(73) Assignee: Visteon Global Technology, Inc., Dearborn, MI (US)

( * ) Notice: Subject to any disclaimer, the term of this patent is extended or adjusted under 35 U.S.C. 154(b) by 0 days.

(21) Appl. No.: 09/578,394

(22) Filed: May 25, 2000

(51) Int. Cl.$^7$ .............................. H01L 23/28; H05K 5/06
(52) U.S. Cl. .................... 174/52.2; 174/52.3; 257/682; 257/693; 257/789; 257/712; 361/749; 361/752; 439/77
(58) Field of Search .................. 174/52.2, 52.3, 174/52.4, 254; 257/682, 693, 789, 712; 361/749, 752, 776; 439/67, 77

(56) References Cited

U.S. PATENT DOCUMENTS

| | | |
|---|---|---|
| 3,909,504 | 9/1975 | Browne . |
| 3,999,285 | 12/1976 | Lewis et al. . |
| 4,409,641 | 10/1983 | Jakob et al. . |
| 4,855,867 | 8/1989 | Gazdik et al. . |
| 4,961,806 | 10/1990 | Gerrie et al. . |
| 4,999,741 | 3/1991 | Tyler . |
| 5,041,943 | 8/1991 | Ilardi et al. . |
| 5,097,390 | 3/1992 | Gerrie et al. . |
| 5,166,864 | 11/1992 | Chitwood et al. . |
| 5,170,326 | 12/1992 | Meny et al. . |
| 5,285,559 | 2/1994 | Thompson et al. . |
| 5,317,478 | 5/1994 | Sobhani . |
| 5,491,300 | * 2/1996 | Huppenthal et al. ................ 174/151 |
| 5,584,120 | * 12/1996 | Roberts ................................ 29/846 |
| 5,655,291 | 8/1997 | Todd et al. . |
| 6,255,949 | * 7/2001 | Nicholson et al. ............... 340/572.8 |

* cited by examiner

Primary Examiner—Dean A. Reichard
Assistant Examiner—Hung V Ngo
(74) Attorney, Agent, or Firm—Larry I. Shelton

(57) ABSTRACT

An electronic assembly includes a flexible multilayer substrate having integral electrically-conductive traces that also includes, as a lowermost layer, a metal foil. A plurality of uppermost layers, likewise including a metal foil, form a thin barrier member that is sealingly attached to the substrate's other layers. In this manner, a plurality of electronic components, mounted on the substrate's other layers so as to be electrically interconnected with the traces before sealingly attaching the barrier member, are encapsulated within metal foil to provide an environmentally-sealed assembly featuring improved resistance to moisture diffusion and penetration/permeation of other substances characteristic of the assembly's service environment into the assembly. A filler material, also encapsulated within the metal foil, is operative to neutralize a predetermined amount of a penetrant, further improving the operability and service life of the assembly. Preferably, a relatively-rigid polymeric material is formed in touching contact with the substrate, as by overmolding the plastic material on the environmentally-sealed assembly, to thereby provide a plastic part incorporating the assembly.

32 Claims, 2 Drawing Sheets

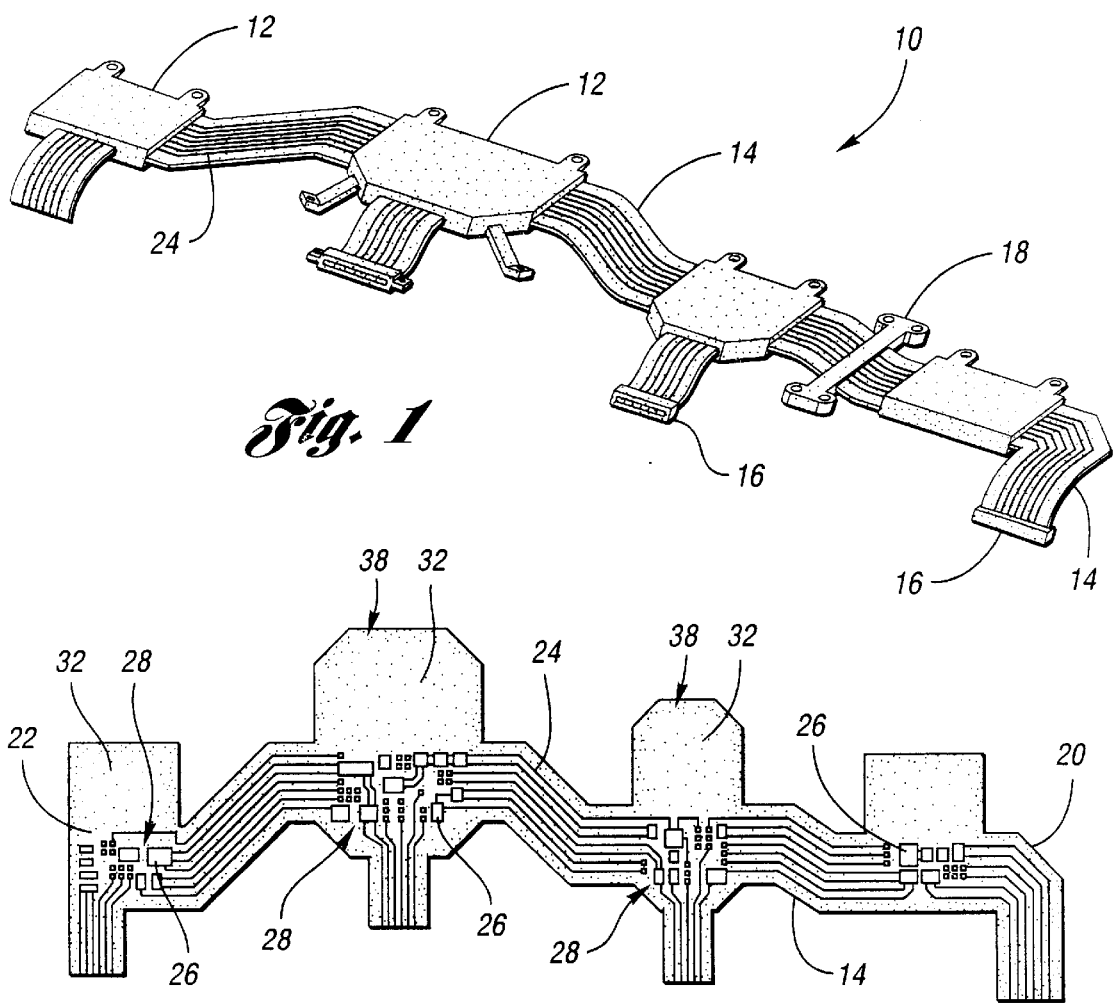
*Fig. 1*
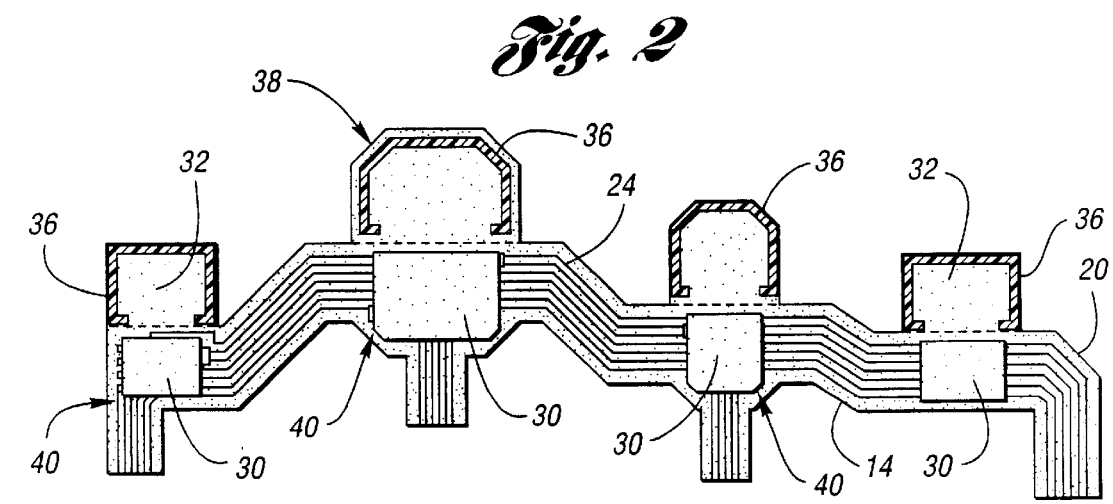
*Fig. 2*
*Fig. 3*

ENVIRONMENTALLY-SEALED ELECTRONIC ASSEMBLY AND METHOD OF MAKING SAME

BACKGROUND OF THE INVENTION

1. Field of the Invention

The invention relates to electronic assemblies adapted to operate in relatively harsh service environments.

2. Background Art

Modern electronic assemblies must often operate in relatively harsh environments. For example, in some automotive applications, electronic assemblies must be able to withstand severe vibration, drastic temperature fluctuations (e.g., between about −40° C. and about 125° C.), corrosive and/or particle-laden exhaust fumes, high atmospheric moisture, and so forth. In response, the prior art teaches providing mechanical protection for an electronic assembly by placing the electronic assembly within a protective housing. The prior art also teaches providing an electronic assembly with a measure of resistance to moisture and/or chemical attack by potting the entire assembly, or portions thereof, in a relatively moisture-impervious potting material, such as an epoxy or silicone material.

In accordance with another prior art approach, as disclosed in U.S. Pat. No. 5,317,478, a hermetically-sealed electronics package includes an electronic element located on a multilayer flexprint substrate. A cover, which may itself form the top layer of the multilayer flexprint or a separate flexprint, is supported above the electronic element by a frame structure, whereupon a periphery of the cover is sealingly attached to the substrate. The frame structure provides support for the flexprint cover to prevent deformation of the cover and resulting damage to the underlying circuit. The electronics package is thereafter itself attached to a suitable mounting structure within the vehicle.

However, these and other previously-known approaches often suffer from one or more drawbacks. For example, even when generally well-sealed against water penetration, known protective housings typically fail to protect the assembly's electronic components against long-term moisture penetration, e.g., due to the diffusion of moisture through a given potting material, whereupon the penetrated moisture will likely detrimentally affect the performance, functionality and/or service life of the assembly's electronic components. And, in the event that certain contaminants are either trapped within the potted assembly or, alternatively, form a portion of the service environment within which the assembly is operated, the moisture and contaminants can often combine within the assembly to form a corrosive solution, thereby further deteriorating the performance, functionality and service life of the assembly's components. Moreover, the requirement of separate supporting structures upon which to mount each sealed prior art electronics package will be seen to substantially increase manufacturing and assembly complexity and cost.

SUMMARY OF THE INVENTION

It is an object of the invention to provide an environmentally-sealed electronic assembly, preferably produced by a relatively low-cost process, featuring protection against harmful environmental operating conditions without the aforementioned drawbacks.

Under the invention, an electronic assembly is provided for use in a service environment that is characterized by at least one penetrant, wherein the term "penetrant" is understood to encompass substances present in the service environment which penetrate and/or permeate into the assembly over time; substances formed within the assembly as the result of such penetration and/or permeation of substance constituents, or the combination of either such substances or substance constituents; with other constituents, e.g., process contaminants, which are internal to the assembly upon manufacture thereof. The electronic assembly of the invention includes a thin, flexible substrate having a first face, a first portion of which includes a pattern of electrically-conductive traces; at least one electronic component mounted on the substrate's first portion such that the electronic component is electrically interconnected with the pattern of traces; a filler material over at least one mounted component, wherein the filler material is operative to neutralize a predetermined quantity of the penetrant; and a thin barrier member having a peripheral portion sealingly attached to the first face such that the electrical component and the filler material are encapsulated between the substrate and the barrier member.

The barrier member includes a first metal foil or other similar, highly-moisture impervious film to thereby render the barrier member relatively impervious to moisture diffusion, as well as to reduce the likelihood of penetration/permeation of other substances or substance constituents in the service environment into the assembly. Preferably, the electronic assembly's substrate similarly includes, as one of the substrate's lowermost layers, a second metal foil or other similar, highly-moisture-impervious film, whereby the mounted electronic components and the filler material are further fully encapsulated within metal foil or film. And, in a preferred embodiment, the barrier member is integrally formed with the substrate, for example, as an adjacent portion of the substrate which is folded over the first portion to thereby encapsulate the assembly's electronic components and the filler material.

In accordance with a further feature of the invention, the assembly preferably includes a relatively-rigid polymeric material formed in touching contact with at least one of the substrate and barrier member, as by overmolding or insert-molding the polymeric material about the substrate after the barrier member has been sealingly attached. In this manner, the molded polymeric material may define a plastic part associated with the resulting electronic assembly, with the plastic part providing such additional structural features as mounting structures for use with the electronic assembly. As a further benefit, at least one heat sink may be attached to the substrate, for example, on a second face opposite its first face, during overmolding/insert molding.

In accordance with another feature of the invention, in another preferred embodiment, the filler material is preformed to a first shape, wherein the first shape includes recesses adapted to receive mounted electronic components. In this manner, the preformed filler material may include sections having different thickness which, when applied over the mounted electronic components, provides a relatively constant height to the resulting assembly.

Under the invention, a method for making an electronic assembly, adapted for use in a service environment characterized by at least one such penetrant, includes mounting at least one electronic component on a first face of a thin flexible substrate, wherein the first face of the substrate includes a first surface portion having a pattern of electrically-conductive traces, and wherein mounting includes electrically interconnecting the pattern and the electronic component; and applying a filler material over at least one mounted component, the filler material being operative to neutralize a predetermined quantity of the penetrant.

By way of example only, a preferred method for practicing the invention includes preforming the filler material into a first shape, wherein the first shape preferably includes a first side having at least one recess adapted to receive at least one of the mounted components. Preferably, the preform's first shape includes a first section having a first thickness and a second section having a second thickness, with the first thickness being greater than the second thickness, whereby a generally flat preform surface is provided for juxtaposition with the barrier member as described below. In this manner, the resulting electronic assembly may be advantageously provided with a generally flat upper surface.

The method further includes sealingly attaching a peripheral portion of a thin barrier member, which itself includes a first metal foil, to the substrate's first face so as to encapsulate the electrical components and the filler material between the substrate and the barrier member. By way of example only, in a preferred method, the step of sealingly attaching the peripheral portion of the thin barrier member to the substrate's first face includes providing a quantity of an adhesive material between the barrier member's peripheral portion and an opposed second surface portion of the substrate's first face. Alternatively, the invention contemplates bonding the peripheral portion of the barrier member to the first face of the substrate. An inert gas may be used to displace air located between the barrier member and the first portion of the substrate to improve the reliability of the resulting part.

In accordance with another feature of the invention, a preferred method includes forming a relatively-rigid plastic part in touching contact with at least one of the substrate and the barrier member, after the barrier member is sealingly attached to the substrate. By way of example only, the forming step may include overmolding a polymeric material, or otherwise fully encapsulating the first portion of the substrate and the barrier member in a molded plastic material.

Other objects, features and advantages of the present invention are readily apparent from the following detailed description of the best mode for carrying out the invention when taken in connection with the accompanying drawings.

BRIEF DESCRIPTION OF THE DRAWINGS

FIG. 1 is a view in perspective of a first exemplary automotive part incorporating overmolded, environmentally-sealed electronic assemblies in accordance with the invention;

FIG. 2 is a plan view of the first exemplary part of FIG. 1 during its manufacture, wherein electronic components are mounted in a plurality of discrete groups on a first surface portion of a flexible substrate;

FIG. 3 is a plan view of the first exemplary part of FIG. 1 during its manufacture, wherein a suitable filler-material preform is positioned over each group of electronic components, and wherein a suitable adhesive is applied about the periphery of a second portion of the flexible circuit prior to folding the second portion over the first portion;

DETAILED DESCRIPTION OF THE PREFERRED EMBODIMENTS

Figure 4:
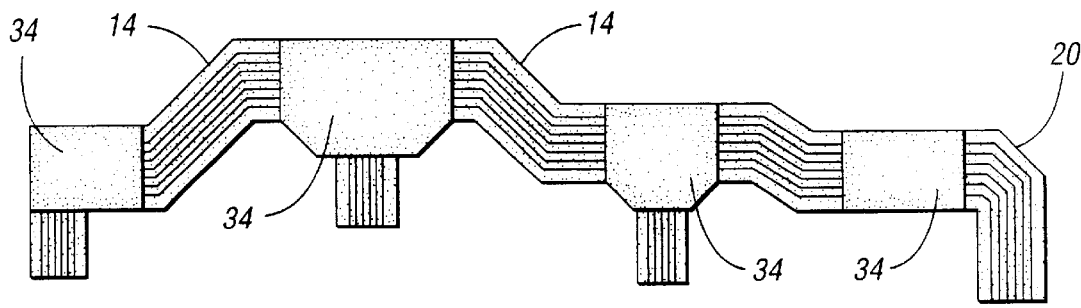
FIG. 4 is a plan view of the first exemplary part of FIG. 1 during its manufacture, wherein the second portion of the flexible circuit has been folded over the first portion such that the periphery of the second portion is sealingly attached to the first portion by the previously-applied adhesive.

A first exemplary over-molded, environmentally-sealed electronic assembly 10 in accordance with the invention is illustrated in FIGS. 1–4. Specifically, the first exemplary electronic assembly 10 includes a plurality of circuit modules 12 that are linked together with suitable lengths of flexible circuit 14. Certain modules 12 include an additional length of flexible circuit 14 with a suitable terminal connector 16. The first exemplary electronic assembly 10 further includes an over-molded mounting structure 18 by which additional attachment points are defined on the electronic assembly 10.

The various constituent parts of the first exemplary assembly 10 are best described in the context of a preferred method for making the assembly 10, as illustrated in FIGS. 2–4. Specifically, the manufacture of the first exemplary electronic assembly 10 begins with a thin, flexible substrate 20 wherein a first face 22 of the substrate 20 includes a pattern of electrically-connected traces 24. At least one and, preferably, a plurality of electronic components 26 are mounted on the substrate's first face 22 in electrical interconnection with the conductive traces 24 to thereby define a plurality of component-populated portions 28 on the substrate 20.

As seen in FIG. 3, a filler material 30, preferably provided as a preform, is positioned over each component-populated portion 28 of the substrate 20. The filler material 30 is operative to neutralize a predetermined quantity of a penetrant to which the first exemplary electronic assembly 10 will be subjected in its normal service environment. Specifically, under the invention, the term "penetrant" is understood to encompass substances present in the surface environment which penetrate and/or permeate into the electronic assembly 10 over time; substances formed within the electronic assembly 10 as the result of such penetration and/or permeation of substance constituents; or the combination of either such substances or substance constituents with other constituents, e.g., process contaminants, which are internal to the electronic assembly 10 upon its manufacture.

Referring again to FIG. 2, the flexible substrate 20 advantageously includes a plurality of second portions 32 formed adjacent to the component-populated portions 28 which, as better shown in FIG. 4, can be conveniently folded over the component-populated portions 28 of the substrate 24 to thereby encapsulate both the electronic components 28 and the filler material 30. In this manner, the second, adjacent portions 32 of the substrate 20 ultimately define a thin barrier member 34 which overlies each component-populated portion 28 of the electronic assembly 10.

As illustrated in FIG. 3, the second, adjacent portions 32 of the substrate 20 are correspondingly secured to component-populated portions 28 of the substrate 20 by a quantity of an adhesive material 36 that is applied between a peripheral portion 38 of the substrate's second portion 32 and a correspondingly-opposed portion 40 of the substrate's first face 22. The invention contemplates any suitable mechanism for securing the second, adjacent portion 32 of the substrate 20 over its component-populated first portion 28, including the use of heat-sealing coatings, dispensed or preform adhesives, or any other suitable process. Significantly, the substrate's second, adjacent portion 32 can be sealed to the opposed portion 40 on the substrate's first face 22 in a single step or, in the alternative, can be partially sealed to thereby create a contained enclosure within which filler material 30 may be inserted. Such an enclosure advantageously permits use of powdered or other particulate filler material, as well as any foamed or liquid filler material.

In accordance with another feature of the invention, a relatively-rigid polymeric material, over-molded or insert-molded about or adjacent to the substrate 20 after the barrier members 34 have been sealingly attached to the substrate's upper face 22, defines the assembly's several modules 12 and mounting structures 18. The over-molded or insert-molded polymeric material advantageously provides the modules 12 of the resulting electronic assembly 10 with additional protection against damage from handling and installation. While the invention contemplates the use of any suitable polymeric material, suitable materials include thermoplastic resins, such as ABS (acrylonitrile-butadiene-styrene), Polypropylene (PP), and polyethylene (PE); polyesters such as Nylon (polyamide), and PEI (Polyetherimide); other polymer resins, such as thermosets and elastomeric resins, including epoxies, phenolics, and unsaturated polyesters; other thermosetting materials such as sheet molding compound, and thick molding compound; and other elastomers such as silicone, rubber, and polyurethane.

Figure 5:
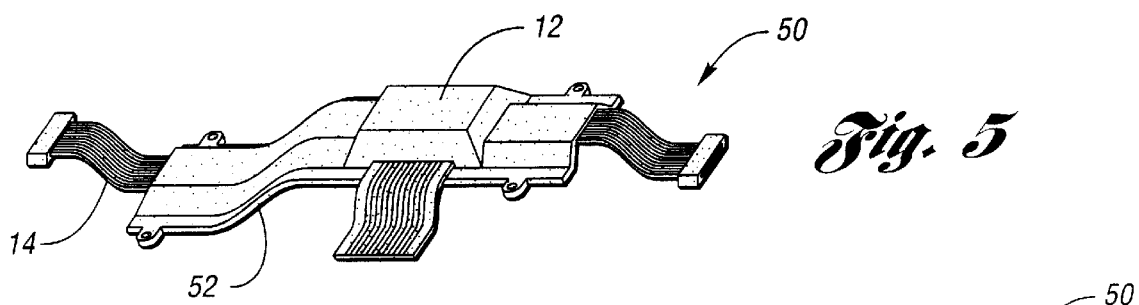
FIG. 5 is a perspective view of a second exemplary automotive part incorporating an integrally-molded, environmentally-sealed electronic assembly in accordance with another feature of the invention.
Figure 7:
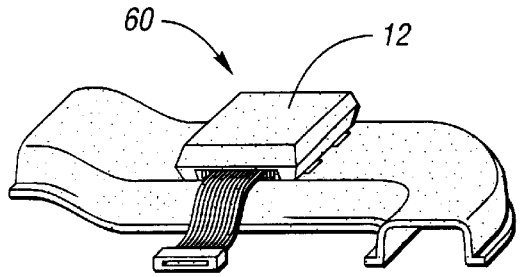
FIG. 7 is a perspective view of a third exemplary automotive part incorporating an integrally-molded, environmentally-sealed electronic assembly in accordance with another feature of the invention, along with an overlying protective cover.

The resulting over-molded modules 12 provide rugged mechanical enclosures that may further serve to define one or more operative surfaces of the resulting assembly 10. Thus, for example, as illustrated in FIG. 5, at least one of the assembly's molded modules 12 advantageously defines operative surfaces and structures of a vehicle air duct panel 52. Other suitable molded structures include such functional housings as instrumental panel structures, door module cassettes or rear package trays (all not shown). And, as seen in the third exemplary electronic assembly 60 illustrated in FIGS. 7 and 8, the over-molded or insert-molded module 12 may further include at least one heat sink 62 by which to facilitate the transfer of heat away from the assembly's electronic components 26.

Figure 6:
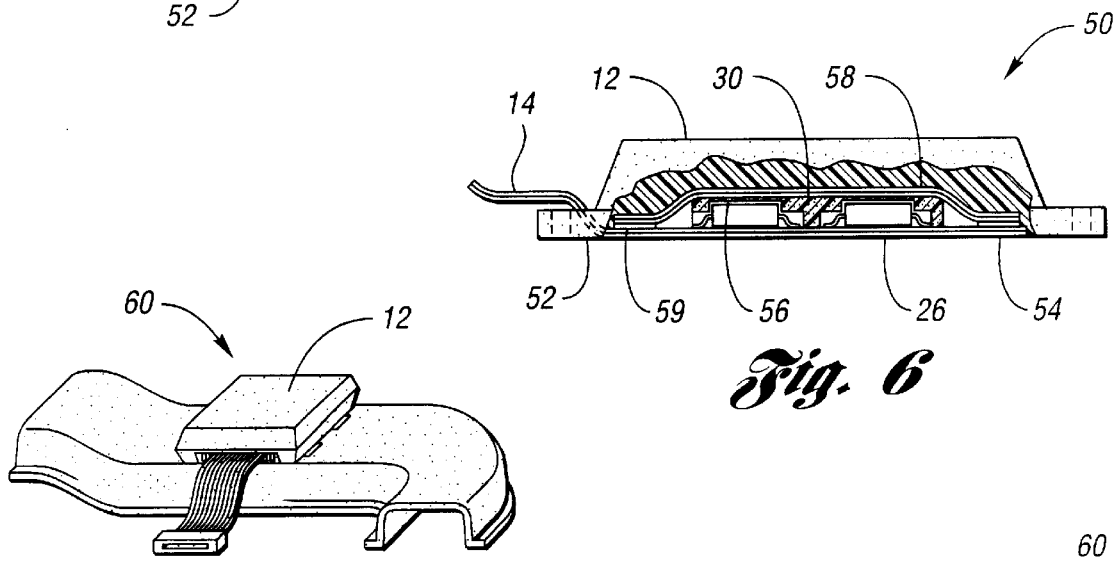
FIG. 6 is a cross-sectional view through the module of the electronic assembly shown in FIG. 5.
Figure 8:
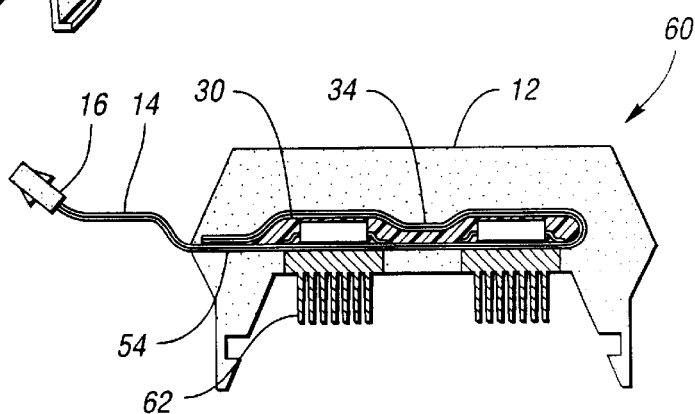
FIG. 8 is a cross-sectional view through the module of the electronic assembly shown in FIG. 7.

In accordance with the invention, as illustrated in FIGS. 6 and 8, the flexible substrate 20 includes, as one of its lowermost layers, a metal foil layer 54 or other similar, highly-moisture-impervious foil or film, whereby the assembly's electronic components 26 and filler material 30 are fully encapsulated within a relatively moisture-impervious and, preferably, EMI-protective barrier. It is noted that the invention contemplates use of a metal foil layer 54 or film that is integrally formed within the substrate 20 or, alternatively, to which electronic circuitry 24,26 is otherwise adhesively bonded. In the latter case, the electronic circuitry 24,26 is preferably bonded to the metal foil layer 54 with an electrically-insulative adhesive (not shown) to thereby electrically insulate the metal foil layer 54 from the substrate's electronic circuitry 24,26. Similarly, it will be appreciated that an insulating polymer film (also not shown) may be advantageously applied over the component-populated portion 28 of the substrate 20 prior to encapsulation to thereby avoid any deleterious electrical contact between the mounted components 26 and the barrier member's metal foil layer 54.

In accordance with another feature of the invention, as illustrated in the cross-sectional view shown as FIG. 6, the filler material 30 may be advantageously preformed to a predetermined shape characterized, for example, by a first side defining a plurality of recesses 56 within which to receive the mounted components 26, and a second side defining a generally planar upper surface. In this manner, the use of a preformed filler material 30 advantageously provides a relatively constant height to the resulting electronic assembly 50 while otherwise ensuring that the mounted electronic components 26 and, particularly, any frangible electrical interconnects between the electronic components 26 and the substrates electrically-conductive traces 24, remain undisturbed in service.

The use of a substantially rigid preformed filler material 30 also advantageously provides internal structural support for the electronic components 26 during the subsequent molding operations, during which external molding forces are exerted. Preferably, to eliminate the presence of air containing moisture within the sealed module 12, dry air or an inert dry gaseous media such as nitrogen is preferably used to purge and fill the module 12 during the sealing of the substrate's second, adjacent portions 32 to the substrate's upper face 22. Alternatively, the invention contemplates use of desecant fillers such as molecular sieves and vapor corrosion inhibitors. As noted above, the filler material 30 can alternatively be provided in powdered form, or as a high-viscous slurry such as an epoxy or polyurethane material that is applied over the component-populated portion 28 of the substrate 20 and cured prior to overlaying the barrier member 34 (e.g., the substrate's second, adjacent portions 32).

As noted above, under the invention, the filler material 30 is selected such that the filler material 30 is operative to neutralize a predetermined quantity of the penetrant. Thus, for example, where the penetrant is a corrosive chemical or substance, the filler material 30 is preferably a corrosion-inhibiting material; and where the penetrant is moisture, the filler material 30 is preferably a desiccant. The invention further contemplates the use of a filler material 30 which otherwise accommodates a further characteristic of the service environment in which the assembly is to be used. For example, where the service environment is characterized by the presence of a level of electromagnetic interference that is not otherwise accommodated by the assembly's encapsulating metal foil, the filler material advantageously further includes metallized particles. In this regard, it is noted that the invention contemplates use of any suitable filler material 30, including solid- or liquid-phase materials, as well as those in either powdered or monolithic form. For example, where the filler material 30 is applied in powdered form, the substrate 20 and the barrier member 34 together preferably define a pocket or enclosure for containing the filler material prior to sealingly attaching the barrier member to the substrate 20.

In accordance with another feature of the invention, as seen in FIG. 6, the barrier member may alternatively be formed of a separate, thin member 58 which overlies the component-populated portions 28 of the substrate 20. The separate member 58 is otherwise preferably sealingly attached to the upper face 22 of the substrate 20 in a suitable manner, as through the use of an applied adhesive 59.

While exemplary electronic assemblies and the associated method of manufacture have been illustrated and described, it should be appreciated that the invention is susceptible of modification without departing from the spirit of the invention or the scope of the subjoined claims. For example, the invention contemplates use of a wide variety of substrates, including housings, covers, shrouds, panels, doors, and any other member providing a planar or nonplanar surface on which electronic components may be mounted; such substrates may be rigid or flexible, and may be constructed of polymer, metal, ceramic, or any combination thereof.

What is claimed is:

1. An electronic assembly for use in a service environment characterized by at least one penetrant, the assembly comprising:
   a thin, flexible substrate having a first face including a first surface portion and a second surface portion, the first surface portion including a pattern of electrically-conductive traces,
   at least one electronic component mounted on the first face electrically interconnecting the pattern and the electronic component;
   a filler material over the at least one mounted component, the filler material being operative to neutralize a predetermined quantity of the penetrant; and
   a thin, multilayer barrier member sealingly attached to the first face about a peripheral portion of the barrier member, the barrier member including a first metal foil;
   wherein the at least one electronic component and the filler material are encapsulated between the substrate and the barrier member.

2. The assembly of claim 1, wherein the substrate is formed of a laminated material that includes a second metal foil.

3. The assembly of claim 2, wherein the barrier member is integrally formed with the substrate.

4. The assembly of claim 1, including at least one heat sink attached to the substrate.

5. The assembly of claim 4, wherein the substrate includes a second face diametrically opposite to the first face, and wherein the at least one heat sink is attached to the second face.

6. The assembly of claim 1, wherein the filler material is preformed to a first shape, the first shape including a first side having a recess adapted to receive one of the at least one mounted electronic component.

7. The assembly of claim 6, wherein the first shape includes a first section having a first thickness and a second section having a second thickness, the first thickness being greater than the second thickness.

8. The assembly of claim 1, wherein the filler material is a corrosion-inhibiting material.

9. The assembly of claim 1, wherein the filler material is a desiccant.

10. The assembly of claim 1, wherein the filler material includes metallized particles.

11. The assembly of claim 1, wherein the barrier member defines a pocket between a first section and a second section thereof, and wherein the substrate and the filler material are contained within the pocket.

12. The assembly of claim 1, further including a polymeric material molded in touching contact with at least one of the group consisting of the substrate and the barrier member.

13. A molded plastic part for use in a service environment characterized by at least one penetrant, the part comprising:
   an electrical assembly including
      a thin flexible substrate having a first face including a first surface portion and a second surface portion, the first surface portion including a pattern of electrically-conductive traces,
      at least one electronic component mounted on the first face electrically interconnecting the pattern and the electronic component,
      a filler material over the least one mounted component, the filler material being operative to neutralize a predetermined quantity of the penetrant, and
      a thin, multilayer barrier member sealingly attached to the first face about a peripheral portion of the barrier member, the barrier member including a first metal foil,
      wherein the at least one electronic component and the filler material are encapsulated between the substrate and the barrier member; and
   a polymeric material molded in touching contact with at least one of the group consisting of the substrate and the barrier member.

14. The part of claim 13, wherein the substrate is formed of a laminated material that includes a second metal foil.

15. The part of claim 13, wherein the filler material is a corrosion-inhibiting material.

16. The part of claim 13, wherein the filler material is a desiccant.

17. The part of claim 13, wherein the filler material includes metallized particles.

18. The part of claim 13, further including a heat sink integrally molded within the part adjacent to one of the group consisting of the substrate and the barrier member, wherein the heat sink forms a surface portion of the part.

19. The part of claim 13, wherein the molded polymeric material defines a plurality of mounting structures on the part.

20. A method for making an electronic assembly, wherein the assembly is adapted for use in a service environment characterized by at least one penetrant, the method comprising:
   mounting at least one electronic component on a first face of a thin flexible substrate, wherein the first face of the substrate includes a first surface portion having a pattern of electrically-conductive traces, and wherein mounting includes electrically interconnecting the pattern and the electronic component;
   applying a filler material over at least one mounted component, the filler material being operative to neutralize a predetermined quantity of the penetrant;
   sealingly attaching a thin, multilayer barrier member to the first face about a peripheral portion of the barrier member so as to encapsulate the at least one electrical component and the filler material between the substrate and the barrier member, the barrier member including a layer of a first metal foil.

21. The method of claim 20, wherein the substrate is formed of a laminated material that includes a metal foil.

22. The method of claim 21, wherein the barrier member is integrally-formed with the substrate.

23. The method of claim 20, including preforming the filler material to a first predetermined shape before applying, the first shape being characterized by a first side having a recess adapted to receive one of the at least one mounted electronic component.

24. The method of claim 23, wherein the first shape includes a first section having a first thickness and a second section having a second thickness, the first thickness being greater than the second thickness.

25. The method of claim 20, wherein sealingly attaching includes providing a quantity of an adhesive material between the peripheral portion of the barrier member and an opposed second surface portion of the first face of the substrate.

26. The method of claim 25, wherein the adhesive material is a curable adhesive, and wherein sealingly attaching includes curing the adhesive material after providing.

27. The method of claim 20, wherein sealingly attaching includes bonding the peripheral portion of the barrier member to the first face of the substrate.

28. The method of claim 20, further including, after sealingly attaching, forming a relatively-rigid plastic part in touching contact with at least one of the group consisting of the substrate and the barrier member.

29. The method of claim 28, wherein forming includes overmolding a polymeric material.

30. The method of claim 28, wherein forming includes fully encapsulating the first portion of the substrate and the barrier member in a molded plastic material.

31. The method of claim 28, wherein forming includes defines a plurality of mounting structures on the part.

32. The method of claim 20, further including displacing air located between the barrier member and the first portion of the substrate with an inert gas.

* * * * *